United States Patent [19]

Chu

[11] Patent Number: 4,742,309

[45] Date of Patent: May 3, 1988

[54] LINE RECEIVER

[75] Inventor: John W. Chu, Cupertino, Calif.

[73] Assignee: Dual-Lite Manufacturing Inc., Naguabo, P.R.

[21] Appl. No.: 948,313

[22] Filed: Dec. 31, 1986

[51] Int. Cl.$^4$ .............................................. H03F 3/45
[52] U.S. Cl. .................................... 330/258; 330/257
[58] Field of Search ............... 330/252, 257, 258, 288, 330/307

[56] References Cited

U.S. PATENT DOCUMENTS

| Re. 29,700 | 7/1978 | van de Plassche | 330/257 |
| 4,634,993 | 1/1987 | Koen | 330/258 X |
| 4,636,743 | 1/1987 | Cotreau | 330/257 X |
| 4,636,744 | 1/1987 | King et al. | 330/257 X |

Primary Examiner—Eugene R. LaRoche
Assistant Examiner—Steven J. Mottola
Attorney, Agent, or Firm—Mattern, Ware, Stoltz & Fressola

[57] ABSTRACT

An improved line receiver with high common mode rejection is operable at voltages above the power supply voltage (VCC) as well as below ground. Input resistors provide high input impedance as well as means through which current summing of current mirror currents at the input transistor base nodes is translated into voltage drops which boosts the common mode rejection range of the circuit. Built-in hysteresis circuitry ensures proper detection of non-common mode signals. The high input impedance and high sensitivity allow multiple receivers of the type to be connected in parallel across a common bus for interrogation by a remote system. The preferred embodiment of the present invention is implemented in integrated circuit technology.

10 Claims, 5 Drawing Sheets

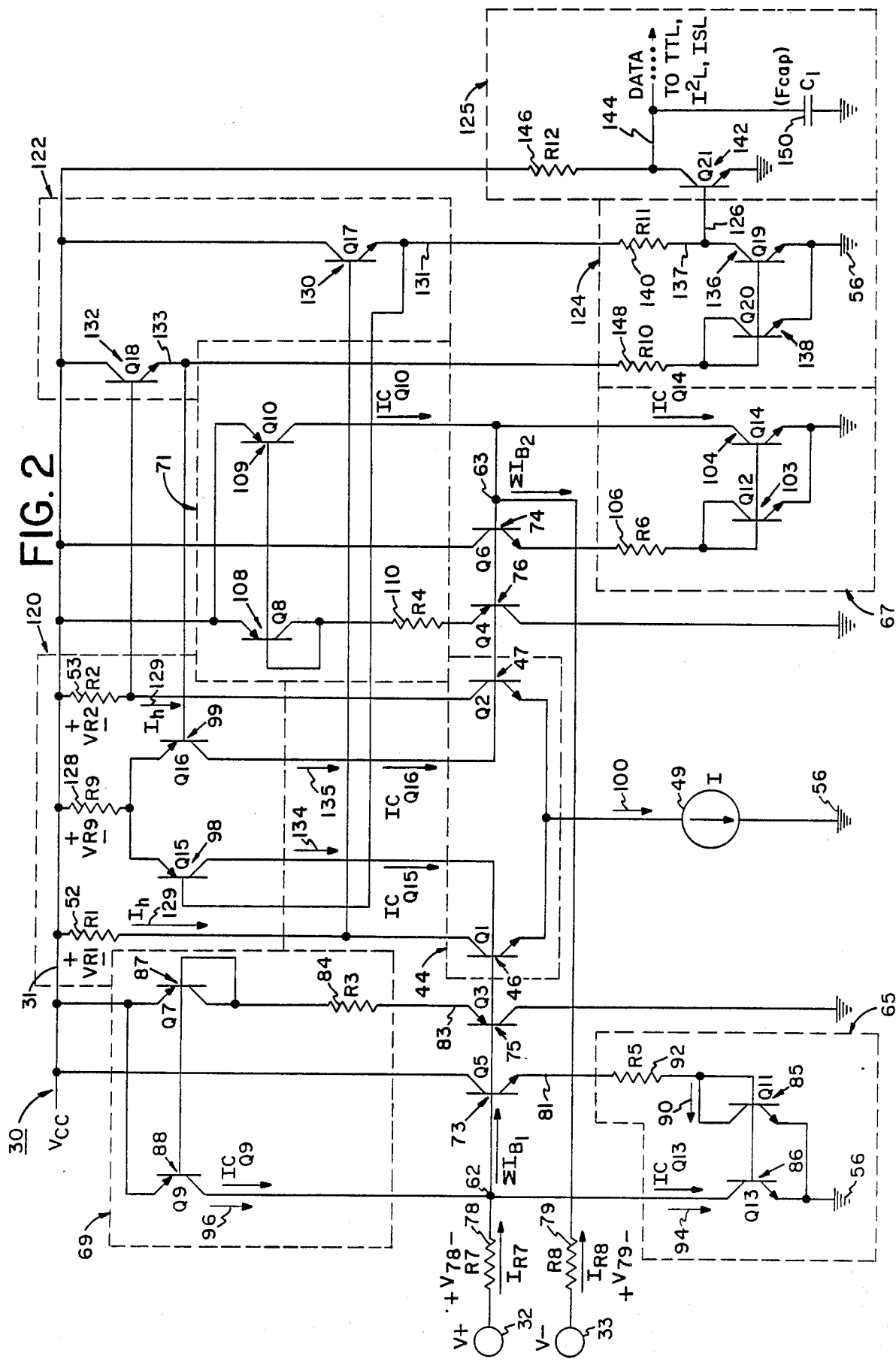

LINE RECEIVER

TECHNICAL FIELD

The present invention is directed to line receivers and in particular to line receivers which have high common mode rejection ratios particularly useful in receiving signals in a noisy electrical environment. One application for such receivers is where they are connected in parallel along the length of a communication bus for interrogation by a master host system.

BACKGROUND ART

There are many applications especially in electronic communications where it is necessary to receive and amplify signals in a relatively noisy electrical environment and where the common electrical potential of the incoming signal can vary widely. Such receivers—which are commonly referred to as line receivers—should therefore be relatively immune to electrical noise while having a high sensitivity with respect to the desired signals for reception. These receivers should further have a high common mode rejection ratio; that is, the ability to reject amplification of electrical potentials which are common to both sides of the input terminals. It is also desirable to have built-in hysteresis so as not to change the receiver's output state unless the differential input signal exceeds a predetermined value. A relatively low frequency response in relationship to the signal's frequency is also desirable so that electrical noise can be filtered to an acceptable low value. Furthermore when many receivers and transmitters share a common bus, it is further desirable that the receivers each have a high input impedance so as not to unduly load the bus and therefore the operation of transmitters on the bus.

The present line receiver achieves these design goals by providing circuitry with high sensitivity, high common mode rejection, built-in adjustable hysteresis, low frequency response in relationship to the signal frequency and a high input impedance.

The typical design of a simple differential amplifier found in the prior art is shown in FIG. 1. As shown there, input lines 20 and 21 have an input voltage impressed across the bases of two matched transistors, wherein the transistors may be of the npn or pnp type (npn type shown). This type of amplifier is known as a balanced differential amplifier since the input signal is not referenced to ground and therefore each transistor "sees" the input signal. It is readily apparent that with such an amplifier a differential signal causes an increase in the forward bias of one transistor's base (such as that for npn transistor 23) and a matched decrease in the forward bias of the other transistor's base (base of transistor 24). If the two transistors are matched and are operating in their linear mode (that is, they are neither saturated nor cutoff), the increase in the emitter current of one transistor will equal the decrease in the emitter current for the other transistor and thus the total current through resistor $R_E$ remains constant.

Correspondingly, the collector currents for the two transistors will vary in a similar manner causing a potential difference across output lines 26 and 27 due to the voltage drops across resistors $R_{C1}$ and $R_{C2}$. These output signals can then be further amplified with a differential amplifier circuit similar to that shown in FIG. 1 but using transistors of the opposite type (in this case of the pnp type). Alternatively, operational amplifiers of the npn type can be used if output lines 26 and 27 are buffered with emitter followers.

The common mode rejection ratio or CMRR is defined as the voltage gain for differential signals divided by the voltage gain for common mode signals. For the circuit shown in FIG. 1, assuming that the external resistor $R_E$ is much greater than the internal emitter resistance $R_e$ of transistors 23 and 24, CMRR is defined by:

$CMRR = 2R_E/(R_{e1} + R_{e2})$, where $R_{e1}$ and $R_{e2}$ are respectively the internal emitter resistances for transistors 23 and 24.

References discussing such simple differential amplifier circuit characteristics can be found in *Electronic Engineering Second Edition*, Alley and Atwood, John Wiley and Sons, Inc. Publishers, 1966, pages 368–371 and *General Electric Transistor Manual of* 1964, pages 111–120.

In addition to such known differential amplifier circuits, Table 1 lists prior art patents which are relevant to the present invention.

TABLE 1

| Patent No. | Inventor | Patent Issued |
|---|---|---|
| 4,375,037 | Ikushima | 1983 |
| 4,378,529 | Dobkin | 1983 |
| 4,361,816 | Schade, Jr. | 1982 |
| 4,361,815 | Schade, Jr. | 1982 |
| 4,320,521 | Balakrishnan et al | 1982 |
| 4,317,082 | Gross | 1982 |
| 4,306,198 | Okada | 1981 |
| 4,303,891 | Achstaetter | 1981 |
| 4,302,726 | Shobbrook | 1981 |
| 4,300,102 | Inoue | 1981 |
| 4,297,646 | LoCascio et al | 1981 |
| 4,296,383 | Jeandot et al | 1981 |
| 4,272,728 | Wittlinger | 1981 |
| 4,271,394 | Leidich | 1981 |
| 4,271,364 | Leonard | 1981 |
| 4,270,092 | Christopherson | 1981 |
| 4,250,461 | Limberg | 1981 |
| Re. 30,587 | Schade, Jr. | 1981 |
| 4,232,271 | Dobkin et al | 1980 |
| 4,216,435 | Ahmed | 1980 |
| 4,157,512 | Schmoock | 1979 |
| 4,141,033 | de Boer | 1979 |
| 4,137,506 | Iwamatsu et al | 1979 |
| 4,117,416 | Schade, Jr. | 1978 |
| 4,101,734 | Dao | 1978 |
| 4,074,205 | Robe | 1978 |
| 4,069,461 | Sano | 1978 |
| 4,063,185 | Kojima et al | 1977 |
| 4,055,775 | Fiedler | 1977 |
| 4,034,306 | Barber et al | 1977 |
| 4,030,043 | Hamilton | 1977 |
| 3,973,215 | Ahmed | 1976 |
| 3,958,135 | Rosenthal | 1976 |
| 3,936,725 | Schneider | 1976 |
| 3,931,580 | Hebda | 1976 |
| 3,921,091 | Van Kessel et al | 1975 |
| 3,917,991 | Ota et al | 1975 |
| 3,916,333 | Zuk | 1975 |
| 3,898,564 | Waldhauer et al | 1975 |
| 3,882,326 | Kruggel | 1975 |
| 3,769,605 | Long | 1973 |
| 3,739,293 | Saari | 1973 |
| 3,733,559 | Thorpe | 1973 |
| 3,638,132 | Trilling | 1972 |
| 3,614,645 | Wheatley, Jr. | 1971 |
| 3,538,449 | Solomon | 1970 |

U.S. Pat. No. 4,376,529, Dobkin, discloses a differential amplifier having an input stage capable of operating in excess of the power supply voltage. It is possible for this circuit to operate from a single power supply and to function with common mode potentials outside the span of the power supply potential. The circuit employs an input stage with a pair of common base connected transistors so that the emitters comprise the circuit input terminals. The transistor collectors are coupled to a current mirror that acts as a collector bias current control and provides the signal output from the stage. The circuit must be configured to the situation where the input common range can be above the positive terminal of a single power supply in which case the input transistors are of the pnp type or where the input common mode can be more negative than the negative supply terminal, in which case npn type transistors are used. Thus, although a current mirror is employed in the circuitry, this circuitry does not disclose or suggest the use of current sourcing and sinking mirrors in combination with input resistors such that the common mode potential can both exceed the supply voltage ($V_{cc}$) or be less than the supply negative potential; i.e., ground. This circuit also does not disclose or suggest the use of hysteresis circuitry for positively identifying non-common mode input signals nor the high input impedance achieved with the present invention. It is therefore submitted that this reference neither discloses nor suggests the present invention.

U.S. Pat. No. Re. 30,587, Schade, Jr., discloses a differential amplifier circuit with common emitter electrode connections to a low voltage power supply terminal and at their collector electrodes through respective current sinks to a point of reference potential. This reference discloses current sinks and current sources in an overall integrated circuit differential amplifier, including operational transconductance amplifiers (OTA's). It is particularly directed to such amplifiers where the power supply voltage magnitudes are very low such as equal to approximately twice the forward-bias base emitter voltage ($V_{be}$) of a bipolar transistor. Prior art amplifiers operating at such low voltages have the problem of not being able to readily track input signals with amplitudes either greater than the power supply positive voltage or less than the power supply negative voltage if relatively high operational speed is to be maintained. In the circuitry disclosed in Schade. Jr., linear operation of the amplifier can extend to below the negative voltage of the power supply. Although the circuitry is stated as being operational for supply voltages much in excess of two times $V_{be}$, including voltages up to 36 volts, no disclosure is presented stating that the amplifier is operational for common mode signals in excess of or less than $V_{cc}$ and ground. Indeed this circuitry does not address the problems solved by the present invention; such as obtaining a high common mode rejection ratio over an extended voltage range outside of the voltage range of the power supply, adjustable hysteresis, and high input impedance. Therefore although current sources and current sinks are used in the circuitry of Schade, Jr., it does not disclose or suggest the inventive aspects of the present invention.

The remaining references are of lesser relevance. All the cited references will be included in the file history of this patent.

SUMMARY OF THE INVENTION

An improved line receiver has high sensitivity, high common mode rejection, built-in adjustable hysteresis, low frequency response in relation to signal frequency and very high input impedance, if desired. The circuit includes an emitter-coupled differential amplifier using a common current source with load resistors.

High input common mode rejection for input voltages much higher than the power supply voltage ($V_{cc}$) or much below ground is accomplished through the use of current summing nodes with the addition of sinking current mirrors and sourcing current mirrors. Input resistors provide the necessary high AC impedance as well as the means through which current summing at the base nodes is translated into voltage drops which increase the common mode rejection range of the circuit. A resistor connected between $V_{cc}$ and the emitters of a pair of transistors form a voltage hysteresis generator by having the transistors' respective collector outputs connected to the base inputs of the differential amplifier circuit. The resistance value of this resistor adjusts the amount of hysteresis for insuring desired turn-ON and turn-OFF of the respective transistors of the differential amplifier.

The circuit can be fabricated using integrated circuit technology; including the input resistors which can be fabricated using thin film technology. Alternatively, these resistors can be implemented by placement in electrically floating tanks formed within the integrated circuit. The circuit disclosed is particularly for use as part of a communication device fabricated in an integrated circuit for allowing a plurality of such devices to be placed across a two-wire bus which in turn is connected to a central station. The central station through presentation of proper communication signals can interrogate each receiver (and thereby external devices connected thereto). The individual receiver circuits do not load down the two-wire bus so as to prevent such communication, even if up to 256 such receivers are placed on the bus in the preferred embodiment. The communication circuit can be connected to a programmable testing circuit used in conjunction with emergency lighting and related equipment so as to be able to interrogate the status of such equipment as well as to invoke predetermined tests to be performed by such emergency lighting and related equipment and thereby ascertain their operational status. Details of such emergency lighting testing equipment can be found in co-pending U.S. application Ser. No. 06/696,262, filed 1/30/85, for Emergency Lighting Supervisory System.

OBJECTS OF THE INVENTION

Therefore it is a principal object of the present invention to provide an improved line receiver with a high common mode rejection ratio over a wide range of voltages both in excess of the supply voltage and less than the ground voltage to the circuit.

Another object of the present invention is to provide a line receiver of the above description having adjustable hysteresis so as to insure fast, snap-action arrival at the fully ON state of one of the differential amplifier transistors upon the difference input signal exceeding a predetermined amount.

An additional object of the present invention is to provide a line receiver of the above description further having high input impedance including high alternating current input impedance so as to allow multiple receivers of this type to be connected in parallel across a two-wire bus while not electrically loading the bus beyond a predetermined amount.

A still further object of the present invention is to provide a line receiver of the above description in which high AC input impedance is achieved through use of input resistors which absorb the majority of common mode signals, thereby enabling the receiver to operate even though the common mode signals may be higher than the supply voltage or be less than its reference value (ground).

A still further object of the present invention is to provide a line receiver of the above description which can be interfaced to emitter-coupled logic (ECL) and can also be interfaced to transistor-transistor logic TTL, integrated injection logic ($I^2L$) and integrated Schottky logic (ISL) type logic circuitry with the use of one or more additional output modules.

Other objects of the present invention will in part be obvious and will in part appear hereinafter.

THE DRAWINGS

In a fuller understanding of the nature and objects of the present invention, reference should be made to the following detailed description taken in conjunction with the following drawings, in which:

FIG. 2 is a schematic diagram of the line receiver according to the present invention.

BEST MODE FOR CARRYING OUT THE INVENTION

Figure 3:
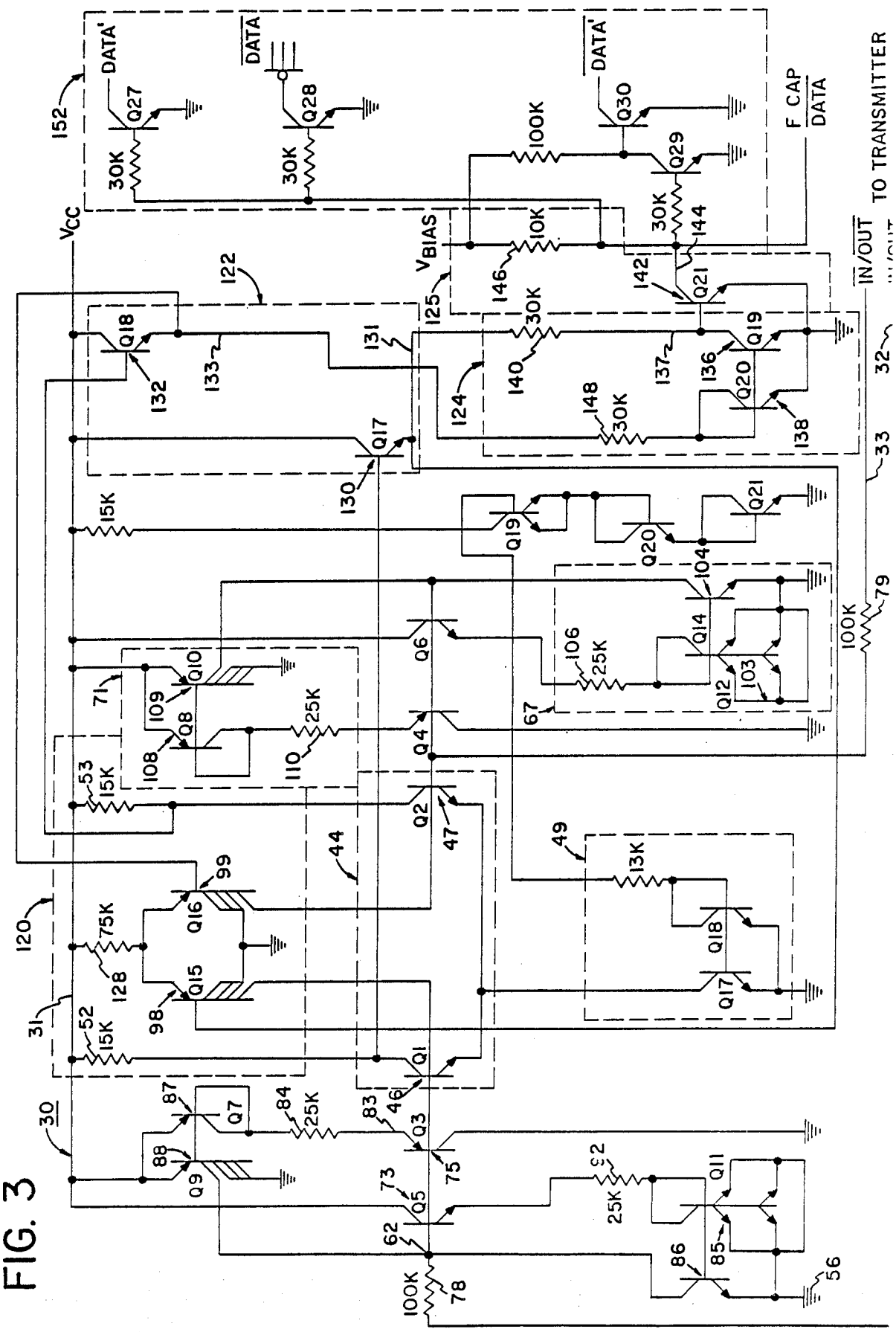
FIG. 3 is a schematic diagram of the line receiver according to the present invention as implemented on an integrated circuit.

A generalized schematic diagram of a line receiver 30 according to the present invention is shown in FIG. 2. FIG. 3 is a schematic diagram of the same line receiver circuitry as implemented on an integrated circuit chip. The particular chip on which this line receiver has been implemented is identified by part number DC 5007 as fabricated by Exar Integrated Systems Inc., 750 Palomar Ave., Sunnyvale, Calif. 94088, United States of America. This particular integrated circuit incorporates a complete communications chip as shown by the function block diagram of FIG. 5. The receiver incorporates a pair of input terminals 32 and 33 for receipt of data represented by the voltage difference between these terminals.

Figure 4:
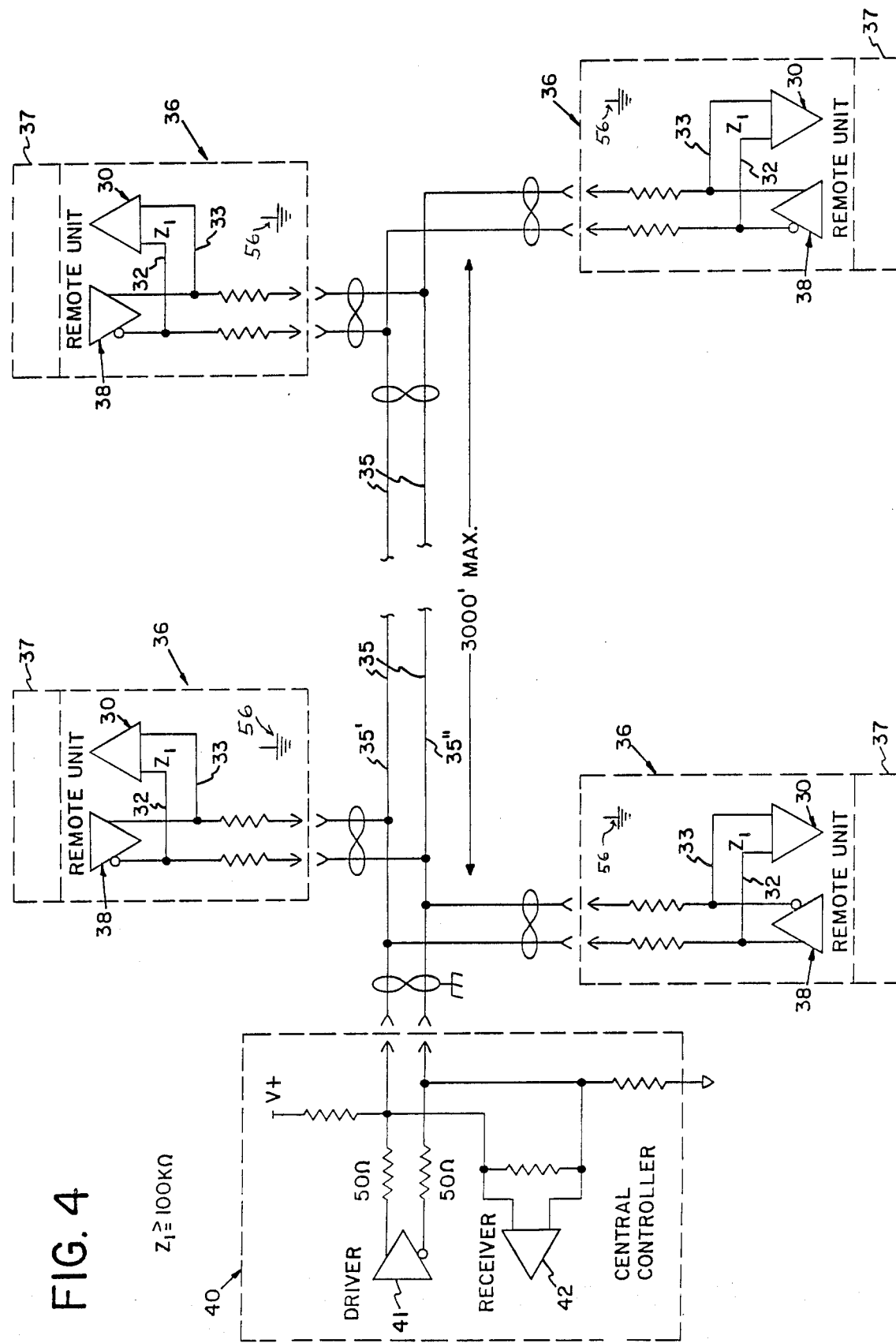
FIG. 4 is a diagrammatic view of a plurality of remote stations incorporating line receivers according to the present invention interconnected via a two-wire bus to a central controller for initiating and receiving results from tests performed at the remote stations.

In a typical application, a plurality of line receivers 30 are connected in parallel to a two-wire bus 35 as shown in FIG. 4. Each line receiver can be part of a remote unit 36. The remote units further include individual transmitters 38 so that a central controller 40 can interrogate any of the remote units through unique addresses associated with each unit. To accomplish this result, the central controller further includes a transmitter driver 41 and a receiver 42 similar or identical to transmitters 38 and receivers 30.

Figure 5:
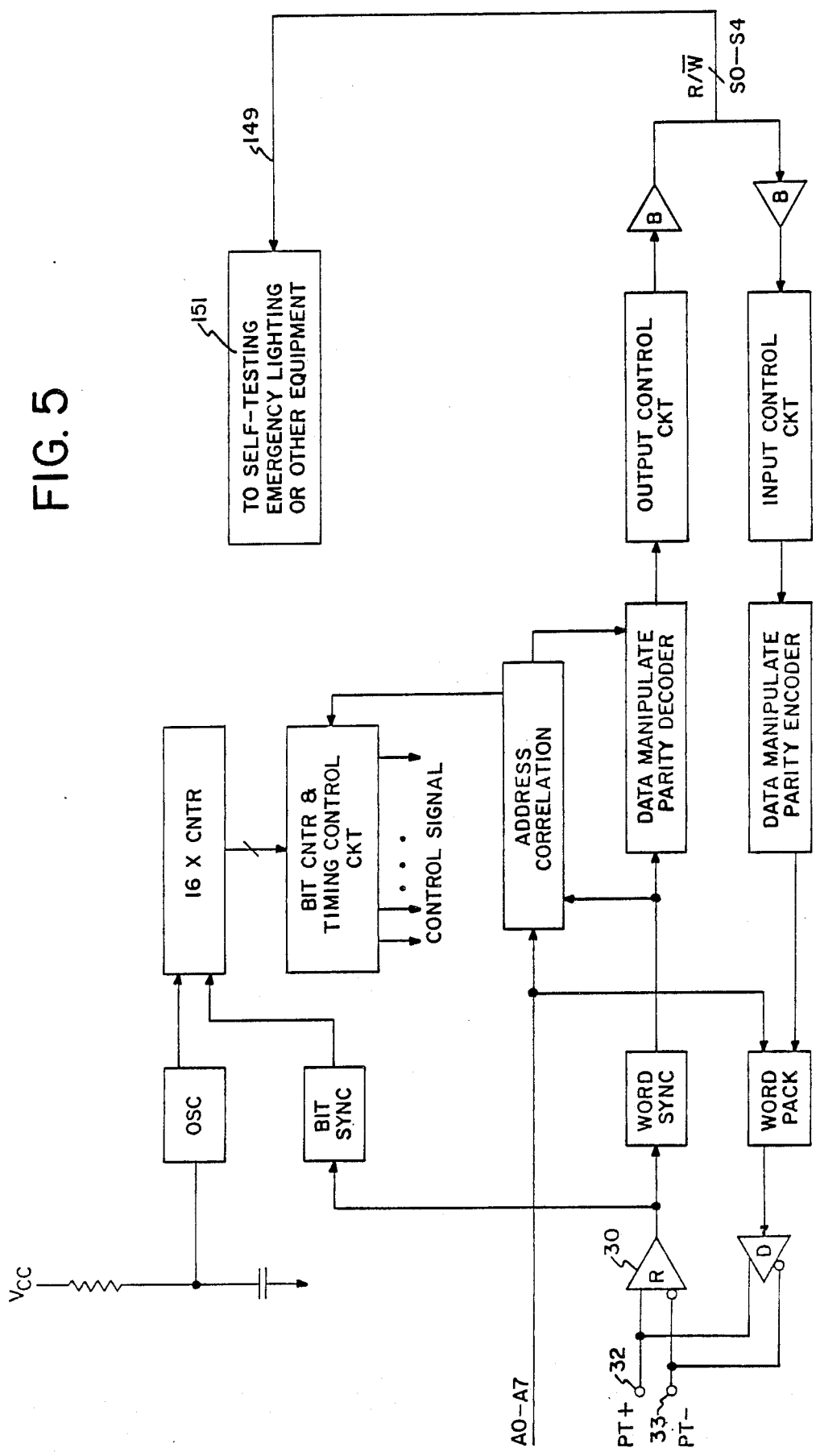
FIG. 5 is a functional block diagram of an entire integrated circuit communications chip for interfacing with a self-testing integrated circuit chip used to diagnose the operation of remote electronic circuitry such as emergency lighting equipment.

As seen in FIG. 4, one typical use for the improved line receiver according to the present invention is to interface with a plurality of self-diagnostic testing units connected to emergency lighting equipment so that the central controller 40 can interrogate any remote unit. The remote unit includes a parallel data interface 37 which responds if its address is selected. This interface is shown in FIG. 5. The self-testing emergency lighting equipment 151 can correspond to that identified in co-pending U.S. application Ser. No. 06/696266 filed Jan. 30, 1985, by the present assignee for an Emergency Lighting Supervisory System, hereby incorporated by reference.

When the parallel interface responds, circuitry of self-testing emergency lighting system 151 attached to read/write line 149 (see FIG. 5) can be interrogated with parallel data transferred via read/write lines 149 from the emergency lighting equipment 151, through interface 37, to remote unit 36, and then by lines 35' and 35" to central controller 40. Such interrogation can include periodic diagnostic tests to the lighting equipment with the results transferred to central controller 40.

Referring again to FIG. 2, the improved line receiver 30 comprises an emitter-coupled differential amplifier 44 comprising transistors 46 and 47, with their emitters connected to a constant current source 49 and their respective collectors connected to load resistors 52 and 53. Such a differential amplifier is well known in the art and has a small signal gain of $2g_mR_L$, where $g_m$ equals the current passing through constant current amplifier 49 (I) divided by $V_T$ which in turn is equal to the collector current times q, the unit electron charge, divided by Boltzmann constant (k) times T, where T is the absolute temperature, and where $R_L$ is equal to resistor 52 or resistor 53. Such a differential amplifier also has a large signal voltage swing of $I \times R_L$ at the collectors of transistors 46 and 47.

Line receiver 30 shown in FIG. 2 achieves input common mode rejection for input voltages which can be much greater than the power supply voltage $V_{cc}$, or less than ground. The common mode rejection ratio, sometimes referred to as CMRR or CMR, is defined as the ratio of the differential gain as a result of a voltage difference between the inputs to the differential amplifier (i.e., inputs 32 and 33 shown in FIG. 2) divided by the common mode gain of the differential amplifier. The common mode gain is the gain which is a function of a common increase or decrease in the differential input (i.e., terminals 32 and 33 shown in FIG. 2). In many electrical systems, it is not possible to insure that the common mode voltage associated with a pair of input terminals will remain constant over time.

For use of the present invention in association with a plurality of remote units 36 as shown in FIG. 4, wherein these units are all tied to a common two wire bus 35, it is possible that the voltage common to the lines 35' and 35" can vary over many volts and therefore can exceed the powersupply voltage $V_{cc}$ associated with the line receiver and can be less than the ground potential 56 associated with each remote unit 36. The ground potential for each remote unit is, of course, indepentent from that of the other remote units as well as the central controller 40.

Ideally, a differential amplifier, such as transistors 46 and 47 in combination with resistors 52 and 53 shown in FIG. 2, would have zero common mode voltage gain if the transistors and other components were perfectly matched and had exactly symmetrical electrical characteristics. In actuality however, components including transistor gains, resistance values, length of component leads, and other factors including layout of the components, cause this symmetry to diverge, thereby resulting in different gains for a common voltage input to the differential amplifier. Such symmetry and matching is similarly less than ideal if the circuit is implemented on an integrated circuit chip.

As seen in FIG. 2, in order to minimize the common mode gain and thereby maximize the common mode rejection ratio, node 62 associated with input 32 and node 63 associated with input 33 are formed into current summing nodes with the addition of current sinking mirrors 65 and 67 and current sourcing mirrors 69 and 71. Transistors 73, 74, 75 and 76 act as emitter-followers so as to present a high-impedance to input base nodes 62 and 63. Input resistors 78 and 79 provide receiver 30 with the necessary alternating current high-impedance characteristic, as well as a means by which current summing at base nodes 62 and 63 is translated into a voltage drop across corresponding resistors 78 and 79, thereby increasing the common mode rejection range of the circuit.

FIG. 3 illustrates similar circuitry for an integrated circuit implementation of the line receiver. As seen there, the relative areas of the transistors collectors can be varied to achieve proper operation of the line receiver as described below.

ANALYSIS OF COMMON MODE REJECTION RATIO

A typical value for the power-supply voltage ($V_{cc}$) is 3 volts. The following analysis assumes that a small signal, delta$\_$V appears at the base node 62 of circuit 30. With these assumptions, the emitter follower transistors 73 and 75, since operating in their linear mode due to the biasing voltages applied, have constant base-emitter voltage drops ($V_{be}$) and thus transfer the voltage delta$\_$V to the respective emitter nodes 81 and 83. For first order approximation, the base to emitter voltages ($V_{be}$) at transistors 85 and 86 of current sinking mirror 65 and transistors 87 and 88 of sourcing current mirror 69 can be assumed constant and thus the small signal, delta$\_$V, causes an increase to the collector current for transistor 85 (identified by arrow 90) equal to a value of the small signal (i.e., delta$\_$V) divided by the resistance of resistor 92.

The increase in the collector current for transistor 85 is reflected as an increase in the collector current 94 for transistor 86 by approximately:

$$\text{delta}\_I_{c-trans-86} \cong (A_{trans-86} \times \text{delta}\_V)/(A_{trans-85} \times R_{92}); \quad (1)$$

where $A_{trans-86}$ and $A_{trans-85}$ represent the emitter areas for transistors 86 and 85 respectively.

Similarly, for sourcing current mirrors 69 and 71, the increase in voltage delta$\_$V as seen by transistor 75 causes a decrease in the current flow through transistor 87; and repeating the analysis above, the voltage change, delta$\_$V at node 62 causes a decrease in the collector current 96 for transistor 88 equal to approximately:

$$\text{delta}\_I_{c-trans-88} = (A_{trans-88} \times \text{delta}\_V)/(A_{trans-87} \times R_{84}). \quad (2)$$

The analysis of the current change at nodes 62 for a change in voltage delta$\_$V if only the current sourcing mirror 69 and the current sinking mirror 65 are considered (that is, not considering the effects of transistors 98 and 99 and noting further that the current flow through path 100 is essentially constant) is:

$$\text{delta}\_I_{R78} = \text{delta}\_I_{path-94} - \text{delta}\_I_{path-96} + \text{delta}\_I_{base\ currents\ for\ transistors\ 46,\ 73\ and\ 75}. \quad (3a)$$

Since the change in base currents is relatively small as compared to the changes in collector current for path 94 and 96, equation 3a becomes:

$$\text{delta}\_I_{R78} \cong ((A_{trans-86})/(A_{trans-85} \times R_{92}) + (A_{trans-88})/(A_{trans-87} \times R_{84})) \times \text{delta}\_V. \quad (3b)$$

Such a change in current flow through resistor 78 will cause a change in the voltage drop $V_{78}$ across resistor 78 above and beyond what was originally across resistor 78 (that is $V_{78}$ before the appearance of delta$\_$V at node 62). The net increase in the voltage V+ at terminal 32 is therefore:

$$\text{delta}\_V+ = (1 + R_{78} \times ((A_{trans-86})/(A_{trans-85} \times R_{92}) + (A_{trans-88})/(A_{trans-87} \times R_{84}))) \times \text{delta}\_V. \quad (4)$$

In the special case where $A_{trans-86}$ is equal to $A_{trans-85}$ and where $A_{trans-88}$ is equal to $A_{trans-87}$ and further where resistors 78, 92, and 84 are equal to each other, equation 4 becomes:

$$\text{delta}\_V+ = 3 \times \text{delta}\_V. \quad (5)$$

Equation 5 represents the interrelationship between a change in voltage at terminal 32 to a corresponding change in voltage at node 62. Thus, three times the change in voltage at node 62 (that is the input transistor base node) is required at input terminal 32 V+ terminal. Reviewing equation 4, it is apparent that by changing the resistance values for resistors 78, 84 and 92, the ratio between input voltage change at terminal 32 to input voltage change at node 62 can be adjusted to achieve virtually any delta$\_$V+ to delta$\_$V ratio.

Due to the symmetry of the circuit shown in FIG. 2 with respect to the V− terminal 33, a similar analysis can be made with respect to a change in voltage at terminal 33 (that is, delta$\_$V−) as relates to a voltage change at node 63.

Thus, $$\text{delta}\_V- = (1 + R_{79} \times ((A_{trans-104})/(A_{trans-103} \times R_{106}) + (A_{trans-109})/(A_{trans-108} \times R_{110}))) \times \text{delta}\_V_{63}. \quad (6)$$

In the special case where $A_{trans-104}$ is equal to $A_{trans-103}$ and where $A_{trans-109}$ is equal to $A_{trans-108}$ and where the values of resistors 79, 106, and 110 are equal to each other, equation (6) becomes:

$$\text{delta}\_V- = 3 \times \text{delta}\_V_{63}. \quad (7)$$

For the same reasons as given above, the ratio of delta$\_$V− to delta$\_V_{63}$ can be changed by adjusting the resistor values for resistors 79, 106 and 110.

This ratio between a change in terminal input voltage to the base transistor input voltage at the corresponding circuit node (node 62 or 63) is crucial in achieving a large input common mode rejection, since the switching transistors (i.e., transistors 46 and 47) can saturate if overdriven. It should be noted that transistor 85 cannot, by definition (i.e., $V_{CE} = V_{BE}$), saturate. Transistor 86 also cannot saturate because its collector to emitter voltage is: (from Kirchhoff's second rule that the sum of the changes in potential encountered in a complete loop is zero):

$$V_{CE86} = V_{BE73} + V_{R92} + V_{BE85}$$

$V_{cc}$ are typically 420 millivolts for 4.5 volts $V_{cc}$ and 450 millivolts for 20 volts $V_{cc}$. Thus, the change in the voltage between the V+ terminal 32 and the V− terminal 33 must equal this value in order for there to be a change in state at output 144.

TABLE 2

Figure 1:
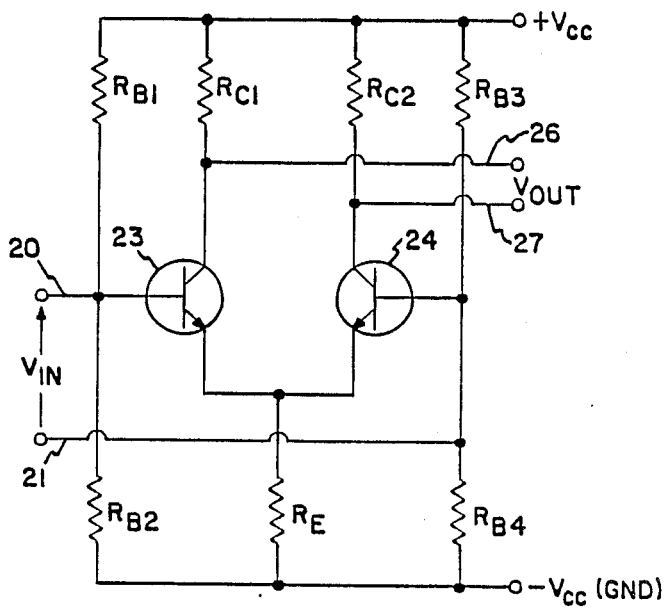
FIG. 1 is a schematic diagram of a prior art differential amplifier circuit.
Figure 6A:
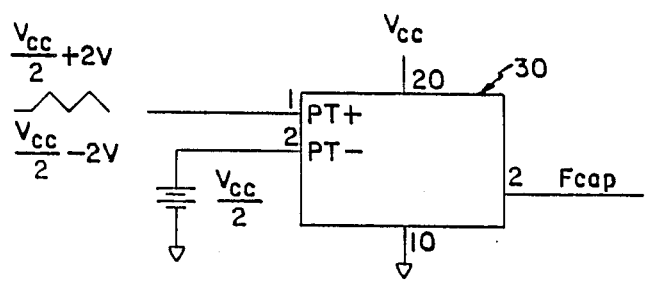
FIG. 6A is a block diagram of how the line receiver shown in FIG. 3 is tested for sensitivity and hysteresis.
Figure 6B:
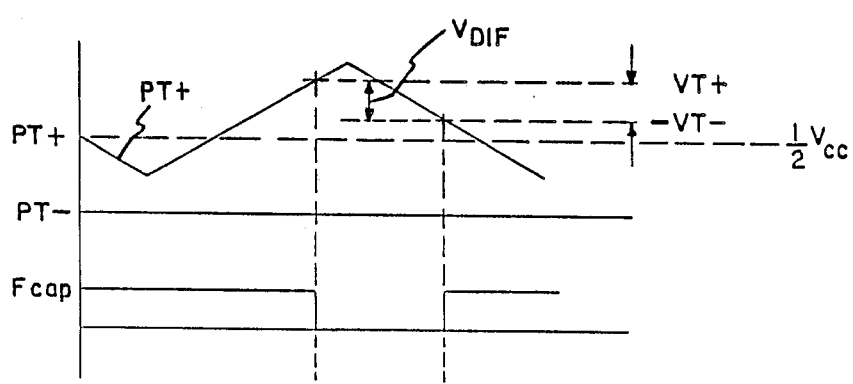
FIG. 6B shows the typical waveforms obtained for the test setup shown in FIG. 6A.

| | | | Electrical Characteristics of Line Receiver | | | | |
|---|---|---|---|---|---|---|---|
| PARAMETER | SYMBOL | $V_{cc}$ | CONDITION | MIN | TYP | MAX | UNIT |
| Line receiver input impedance | $Z_{in}$ | 4.5 V  20 V | $Z_{in} = V_{in}/I_{in}$ | 100  100 | 400  400 | | kilohms |
| Line receiver sensitivity | VDIF | 4.5 V  20 V | FIGS.  6A and 6B | 400  800 | | | mV |
| Line receiver hysteresis margin | (VT+)  −(VT)−) | 4.5 V  20 V | Test FIGS.  6A and 6B hysteresis margin = (V$_T$+) − (V$_T$−) | 300  300 | 420  450 | 500  600 | mV | which is much greater than the saturation voltage of transistor 86. Therefore transistor 86 cannot saturate, and for similar reasons the other current sinking and sourcing transistors cannot saturate.

Thus, by having the corresponding input resistors 78 and 79 absorb most of the input voltage change, the input voltage can go substantially above $V_{cc}$ as well as below ground (reference element 56) without causing either of these transistors to be overdriven. Indeed, common mode rejection exceeding plus or minus 100 volts can be obtained in an integrated circuit implementation of the invention if thin film resistors are used to fabricate resistors 78 and 79.

Such common mode voltages are achievable even when using transistor - transistor logic (TTL) having levels of approximately 2 volts if additional gain stages (not shown) are added to the circuitry shown in FIG. 2. The thin film resistors used for input resistors 78 and 79 isolate the voltage drop from the rest of the integrated circuits substrate. Alternatively, these resistors can be fabricated in electrically isolated tubs on the integrated circuit so as to allow the resistor body voltage to rise substantially above ($V_{cc} + V_{BE}$), a voltage at which the p-n junction between the resistor body and the tub turns ON (thus clamping the resistor body voltage from rising further) should the tub be biased at $V_{cc}$, as in most other cases of resistor implementations.

ANALYSIS OF INPUT VOLTAGE HYSTERESIS GENERATION

As shown in FIG. 2 modules 120 and 122 form an overall input voltage hysteresis generator to insure that unless the voltage difference between input terminals 32 and 33 exceeds an amount as determined by the hysteresis circuitry, the output voltage on line 144 in output module 125 will remain in its previous state. This in turn ensures that small voltage noise at terminals 32 and 33 will not be erroneously interpreted as a change in state for digital information received over bus 35 (FIG. 4) when the receiver is used as part of a remote interface unit 36. This characteristic is especially important where digital information is being received over a bus which may be subject to spurious electrical interference (noise) that could otherwise be misinterpreted as a change in state for a particular bit of information.

As seen in Table 2 and accompanying FIGS. 6A and 6B, when the line receiver according to the present invention is implemented as an integrated circuit for use as a receiver in a configuration shown in FIG. 3, its sensitivity is typically 400 millivolts for a $V_{cc}$ value of 4.5 volts, and 800 millivolts for a $V_{cc}$ value of 20 volts. The line receiver hysteresis margin for similar values of In operation, resistor 128 of module 120 acts as a current source which together with transistors 98 and 99 form an input voltage hysteresis generator. The voltage drop across resistor 128 is approximately equal to the current flow ($I_h$ reference path 129) through resistor 52 times the value of resistor 52, or equal to the current flow through resistor 53 times its resistance value. This result implies that the current flow through transistor 98 or 99, depending upon which transistor is turned ON, is equal to:

$$I_{trans-98} \text{ or } I_{trans-99} = I_h \times R_{52}/R_{128} \tag{8}$$

(this result is due to the fact that the current flow through resistor 128 is equal to the voltage drop across that resistor divided by its resistance; and since the voltage drop is equal to $I_h$ times the resistance value of resistor 52, the current flow through transistor 98 or 99, depending upon which is turned ON, is equal $I_h \times R_{52}/R_{128}$).

The reason why the voltage drop across resistor 128 is equal to $I_h \times R_{52}$ or $I_h \times R_{53}$ is that a Kirchhoff loop would yield such a result. Specifically, if a path is taken from $V_{cc}$ (line 31) through resistor 52, transistor 130, transistor 98, resistor 128, back to $V_{cc}$, the voltage drops are as follows:

$$I_h \times R_{52} + V_{be-trans-130} - V_{be-trans-98} - V_{R128} = 0 \tag{9}$$

Assuming that the base emitter junction voltage for transistors 130 and 98 are equal (which is a reasonable assumption for the transistors shown) and since the voltage drops for $V_{be-trans}-130$ and $V_{be-trans}-98$ are opposite in direction (assuming a plus to minus $V_{be}$ drop for an npn transistor), then equation 9 becomes:

$$I_h \times R_{52} = V_{R128}. \tag{10}$$

Due to circuit symmetry:

$$V_{R128} = I_h \times R_{53}. \tag{10a}$$

Therefore since:

$$I_{c-trans-98} = V_{R128}/R_{128} \tag{11}$$

Substituting for $V_{R128}$ yields:

$$I_{c-trans-98} = I_h \times (R_{52}/R_{128}) \tag{11a}$$

while from equation 10a:

$$I_{c-trans-99} = I_h \times (R_{53}/R_{128}). \quad (11b)$$

In addition, if transistor 46 is turned ON then the voltage drop across resistor 52 (i.e., $I_h \times R_{52}$) causes the emitter of transistor 130 to have a voltage equal to $I_h \times R_{52}$ lower than the emitter voltage of transistor 132; wherein it is noted that these emitter voltages are respectively applied to the bases of transistors 98 and 99. Consequently, pnp transistor 98 is turned ON while transistor 99 is turned OFF in a situation where transistor 46 is turned ON, and vice-versa when transistor 47 is turned ON. Due to the differential amplifier circuitry of emitter coupled differential amplifier 44, either transistor 46 or 47 can be turned ON, but not both simultaneously. Consequently, in a situation where transistor 46 is turned ON, causing transistor 98 to turn ON, the current flow through resistor 128 (that is, $I_h \times R_{52}/R_{128}$) primarily passes through the collector of transistor 98 as represented by arrow 134. This current is therefore directed to node 62 which causes an additional drop in the current flow through resistor 78. That is referring back to equation 3:

$$delta\_I_{R78} = delta\_I_{c-trans-86} - delta\_I_{c-trans-88} - I_{c-trans-98}. \quad (12)$$

Since the current through resistor 78 has been reduced by the current through the collector of transistor 98, a concomitant reduction in the voltage drop across resistor 78 occurs equal to the value of the collector current through transistor 98 times the resistance of resistor 78.

This voltage drop thus causes an increase in the voltage at node 62 for the same value of voltage at terminal V+, and thus it can be seen that if transistor 46 is previously in the OFF state and a voltage is applied between terminals 32 and 33 (positive in nature as between terminals 32 to 33) then as transistor 46 begins to conduct due to a positive base to emitter voltage, a current is supplied by transistor 98. This current is a result of current flow through resistor 52 which occurs when transistor 46 begins to conduct (i.e., current flow through the collector to emitter junction of transistor 46). The current flow through transistor 98 also raises the potential of node 62 and thus increases the base to emitter potential of transistor 46, thereby turning transistor 46 ON still harder which in turn causes increased collector current flow through transistor 46. This positive feedback thereby ensures fast arrival at a final, fully ON state for transistor 46 once it begins to conduct (that is, as it goes from an OFF state into its linear mode operation).

In the above situation where transistor 46 is turned ON, transistor 47 is turned OFF. It is therefore readily apparent that this result in turn causes transistor 99 to be turned OFF (due to the fact, as explained above, that the emitter voltage of transistor 130 is lower than the emitter voltage of transistor voltage 132 by an amount equal to $I_h \times R_{52}$) and consequently, the collector current flow 135 for transistor 99 is approximately equal to 0 which therefore does not have an effect at current summing node 63. Consequently as transistor 47 starts to turn OFF due to a reduction in the voltage at terminal 33, a point is reached where the reduction in current flow through the collector of transistor 47 (and therefore through resistor 53) causes a reduction in the current flow through the collector of transistor 99 which previously was insuring the fully ON state of transistor 47. Thus as transistor 47 begins to come out of the initial fully ON state it is forced further and further out of the fully ON state until complete turn-OFF of transistor 47 results and complete turn-ON of transistor 46 occurs.

Of course, the reverse is true when the polarity of the voltage applied across terminals 32 and 33 is reversed, that is when terminal 33 has a higher potential than terminal 32.

Thus it is seen that the conduction states of transistors 46 and 47 are only reversed when the voltage across terminals 32 and 33 reverses polarity by an amount which is sufficient to overcome the positive feedback current keeping either transistor 46 or 47 turned ON as a result of current flow through resistor 128 as it passes to transistor 46 or 47 via transistor 98 or 99. Thus, in order to turn transistor 46 (or 47) OFF, a voltage change exceeding the increase in voltage at node 62 (or 63) due to current flow through the collector of transistor (98 or 99) must be made in order to start turning transistor 46 (or 47) OFF and transistor 47 (or 46) ON. Since the current flow through transistor 98 (or 99) is inversely proportional to the resistance value for resistor 128 (equations (11a) and (11b) above) it is evident that by adjusting the value of resistor 128 the amount of hysteresis (i.e., voltage change at terminal 32 and 33) necessary to change the state of transistor 46 and 47 is also inversely adjusted. Consequently, a reduction in the resistance value of resistor 128 requires a greater voltage change at terminals 32 and 33 in order to obtain a change in state of the output on line 126 and conversely, an increase in the resistance of resistor 128 requires less change at terminals 32 and 33 to change the state at output 126.

OUTPUT MODULES 125 AND 152

Current mirror module 124 in combination with output module 125 provide the circuitry for interfacing the emitter outputs 131 and 133 of the transistors 130 and 132, so as to be able to interface with TTL, I$^2$L, and ISL types of logic circuitry. Transistors 130 and 132, as emitter followers, are always turned ON and their function is to shift the collector voltages of transistors 46 and 47 down by one $V_{BE}$. Thus, the emitter outputs 131 and 133 represent the same voltage logic swing ($v_1$) as between transistors 46 and 47, which as explained above, have opposite states with respect to each other; i.e., when transistor 46 is ON, transistor 47 is OFF, and vice versa.

If the line receiver is to be interfaced with only emitter coupled logic (ECL) circuitry, all that is required is that the emitter outputs 131 and 133 of transistors 130 and 132 be pulled down via current sources. In this regard, transistors 136 and 138 are a matched npn pair and when fabricated on an integrated circuit, such as shown in FIG. 3, they have substantially identical topographies and orientation, being located side by side in close proximity on the chip. As seen in FIG. 3, for the integrated circuit implementation of the line receiver, resistors 140 and 148 have the same value which thereby implies that the emitter areas of transistors 136 and 138 (their $A_E$) are equal. If their emitter areas are different, then resistors 140 and 148 must match the ratio of the transistor emitter areas. In this configuration, if emitter-coupled logic (ECL) circuitry is to be driven, then the emitter outputs (nodes) 131 and 133 are pulled down by current sources so as to drive ECL gates differentially (such as across emitter outputs 131 and 133) or single-endedly (such as output 131 or 133 singlely).

For driving transistor-transistor logic (TTL) circuitry, integrated injection logic (I²L) circuitry, or integrated Schottky logic (ISL) circuitry, output module 125 shown in FIGS. 2 and 3 is required.

As previously explained, transistors 136 and 138 of current mirror 124 will (assuming these transistors have a high beta) have collector currents equal to each other, and therefore the currents flowing through resistors 140 and 148 will be equal. When the base voltage of transistor 130 is higher than that of transistor 132 by an amount equal to the voltage logic swing ($v_l$) associated with the collector voltages of transistors 46 and 47 then, by Ohm's Law (which states that the current (I) through a resistor is equal to the voltage drop across the resistor divided by the resistance of the resistor):

$$I_{c138} = I_{R148} = (V_{E132} - V_{BE138})/R_{148}; \quad (13)$$

and $$I_{c136} = I_{c138}. \quad (14)$$

(that is, the current flow through resistor 148 is equal to the voltage drop across that resistor divided by the value of the resistance, where the voltage drop across resistor 148 is equal to the emitter voltage at emitter node 133 minus the base to emitter voltage of transistor 138).

It should be noted, however, that transistor 142, whose base junction is connected to the collector output 137 of transistor 136, effectively clamps this collector output voltage at one $V_{BE}$ above ground, thereby yielding:

$$I_{R140} = (V_{E130} - V_{BE142})/R_{140} \quad (15)$$

(that is, the current flow through resistor 140 is equal to the voltage drop across that resistor divided by the value of the resistance, where the voltage drop across resistor 140 is equal to the emitter voltage at emitter node 131 minus the base to emitter voltage of transistor 142).

The current flow through the base emitter junction of transistor 142 (that is, $I_{B142}$) is, by Kirchhoff's first rule (Kirchhoff's first rule states that the sum of the currents entering a node must equal the sum of the currents leaving the node), equal to the sum of the currents entering and leaving collector node 137 of transistor 136; or $$I_{b142} = I_{R140} - I_{c136}. \quad (16)$$

Substituting the value of $I_{R140}$ (equation 15) and the value of $I_{c136}$ from equations (13) and (14) into equation (16) yields:

$$I_{b142} = (V_{E130} - V_{BE142})/R_{140} - (V_{E132} - V_{BE138})/R_{148}. \quad (17)$$

Since for the integrated circuit implementation of the line receiver as shown in FIG. 3, resistors 140 and 148 are identical in geometry and orientation and are placed in close proximity on the integrated circuit chip so that they are closely matched to each other, the values of resistors $R_{140}$ and $R_{148}$ are equal to each other. Of course, in a discrete component implementation of the invention, the values can also be made equal to each other. Thus, $$R_{140} = R_{148}. \quad (18)$$

Therefore, substituting $R_{140}$ for $R_{148}$ in equation (17) yields:

$$I_{B142} = ((V_{E130} - V_{BE142}) - (V_{E132} - V_{BE138}))/R_{140}, \quad (19)$$

or $$I_{B142} = (V_{E130} - V_{BE142} - V_{E132} + V_{BE138})/R_{140}. \quad (20)$$

For an integrated circuit implementation of the present invention, the base emitter junction voltage for transistors 138 and 142 would be substantially equal to each other (this would also be true for a discrete component implementation such as shown in FIG. 2), thereby yielding $$V_{BE142} = V_{BE138}. \quad (21)$$

Substituting equation 21 into equation 20 yields:

$$I_{B142} = (V_{E130} - V_{E132})/R_{140}, \quad (22)$$

which is approximately equal to the voltage logic difference between transistors 46 and 47, that is, $$I_{B142} \cong v_l/R_{140}. \quad (23)$$

Equation (23) thereby ensures that transistor 142 is turned ON when the emitter voltage of transistor 130 is greater than the emitter voltage of transistor 132 by voltage $v_l$ (that is, when transistor 47 is ON and transistor 46 is OFF).

If the base voltage of transistor 132 is higher than that of transistor 130 by $v_l$, a similar analysis indicates that the collector current through resistor 148, which is therefore equal to the collector current of transistor 138, is defined by the following equation:

$$I_{R148} = I_{c138} = (V_{E132} - V_{BE138})/R_{148}. \quad (24)$$

Thus, through geometry matching, transistor 136 has the same collector current.

This result for $I_{c136}$ requires one of two possibilities to be present:

(a) $v_l$, if it is less than $V_{BE} - V_{sat}$ (where $V_{sat}$ is the saturation of voltage for the transistor when it is ON), then the voltage across resistor 140 is identical to the voltage of across resistor 148 and the collector voltage of transistor 136 would be at ($V_{BE} - v_l$).

(b) If $v_l$ is equal to or greater than $V_{BE} - V_{sat}$, then the collector current of transistor 136 is limited by resistor 140 to be below that of the collector current through resistor 148 ($I_{R148}$) and therefore transistor 136 goes into saturation.

In both situations, transistor 142 has no base drive and is therefore turned OFF (the possibility of $v_l$ being insufficiently large enough to cause the above occurrences wherein transistor 142 could remain marginally ON would not be present in the implementation and values as set forth in FIG. 3.) Thus if the base voltage of transistor 132 is higher than the base voltage of transistor 130, transistor 142 is turned OFF.

From the above analysis, it is seen that the collector output of transistor 142 represents the voltage logic swing of transistor 46 and 47. Output module 125 thus current amplifies this voltage logic swing at collector output 144.

FIG. 3 shows additional output circuitry 152 connected to the collector output 144 of transistor 142. This additional circuitry provides additional buffering and drive compatibility to drive I²L or ISL devices.

For the circuitry shown in FIGS. 2 and 3 using modules 124 and 125, it is important that the ratio of resistance values between resistor 148 and 140 as compared to the emitter areas of transistors 136 and 138 be exactly equal so that the current mirror either absorbs or produces a small current to transistor 142 so as to either turn transistor 142 ON or OFF.

Capacitor 150 can be used as a low-pass filter to absorb high-frequency electrical noise that may appear at inputs 32 and 33 so as to prevent its distribution to the interconnected circuitry on output line 144.

Current source 49 can be fabricated by various circuit techniques well known in the art such as shown in FIG. 4.18 of the *General Electric Transistor Manual* (Copyright 1964). FIG. 3 shows a current source as implemented on an integrated circuit chip.

For applications in which higher input impedance is required than the typical 400 kilohms input impedance for the invention shown in FIGS. 2 and 3, Darlington stages can be used to replace switching transistor pairs 46 and 47 and the emitter follower input transistors 73, 74, 75 and 76.

Finally, it should be noted that when input terminals 32 and 33 are open circuited or tied to high-impedance buses, the inputs will seek their own DC level based upon the previous state of input nodes 62 and 63.

Although the above discussion with regard to the theory of operation assumes (1) that the transistors have a Beta or $h_{FE}$ equal to infinity; (2) that there is perfect matching of transistors in the current mirrors and (3) perfect matching of resistor ratios, the actual receiver circuit performs substantially similar to the theoretical operation provided that the transistors have a Beta of at least 100. Non-perfect circuit component-matchings tend to only effect circuit performance as second order effects and therefore will not cause great deviation from the theoretical description presented above.

Thus, what has been described is a line receiver circuit which has a high common mode rejection ratio and which can accept input voltages which exceed $V_{cc}$ or ground by several orders of magnitudes. The circuit also has high sensitivity with built-in hysteresis to insure accurate switching of the receiver's output for effective reception of digital information. The present invention also has high input impedance thereby allowing a plurality of receivers to be connected in parallel to a bus such as associated with a central controlling system used to interrogate a plurality of remote units which may be used for diagnostic testing of emergency lighting equipment.

Having described the invention, what is claimed is:

1. An improved line receiver comprising:
   (A) means for receipt of a differential input voltage wherein such voltage may be algebraically combined with a common mode voltage associated with said differential voltage;
   (B) input resistors each connected at a first end to said differential input means, for providing a voltage drop;
   (C) current summing nodes connected to the second end of each input resistor;
   (D) sinking current mirrors connected to each current summing node so as to absorb current flow from the node to ground;
   (E) sourcing current mirrors connected to each current summing node so as to provide current to the nodes so that current summing at the nodes is translated into voltage drops that increase the common mode rejection ratio of the line receiver;
   (F) means for differentially amplifying the differential voltage between the input terminals; and
   (G) means for receipt of electrical power to energize the receiver;

whereby a high common mode rejection ratio with high input impedance operation is achieved that allows for common node voltages to exceed the receiver's power supply voltage as well as to be less than the receiver's ground potential.

2. An improved line receiver as defined in claim 1, further comprising a constant current source connected to the low potential output of the differential amplifying means.

3. An improved line receiver as defined in claim 2, wherein the differential amplifying means comprises first and second emitter-coupled transistors (46 and 47), each having a base, an emitter and a collector, and associated collector resistors (52 and 53), each collector resistor connected at one end to the collector of one of the first and second emitter-coupled transistors, and further wherein the line receiver comprises a hysteresis circuit for insuring the fast, snap-action turn-ON of one of said differential amplifier transistors with the simultaneous turn-OFF of the other differential amplifier transistor, and vice-versa, by requiring the differential voltage to exceed a predetermined amount before switching the states of the differential amplifier transistors.

4. An improved line receiver as defined in claim 3, wherein the hysteresis circuit comprises third and fourth transistors (98 and 99), each having a base, an emitter and a collector, the transistors connected at their bases to the collector resistor-collector junction of the differential amplifier, the third and fourth transistors emitter coupled to each other and connected to a resistor having a second end connected to the means for receipt of electrical power, the collectors of said third and fourth transistors respectively connected to the bases of the differential amplifying means first and second transistors (46 and 47), further wherein the hysteresis circuit comprises fifth and sixth transistors (130 and 132), each having a base, an emitter and a collector, with the bases of the third and fourth transistors connected to the emitters of the fifth and sixth transistors respectively so that upon initial turn-ON of the differential amplifying means first transistor (46), the voltage at the corresponding collector resistor-collector junction causes the emitter of the fifth (130) transistor to have a voltage lower than the emitter voltage of the sixth transistor (132), thus turning ON the corresponding third transistor (198) whose collector current then causes the associated differential amplifying means first transistor (46) to turn-ON more fully until a fully ON state of the differential amplifying means first transistor (46) is achieved, and wherein the turn OFF of the differential amplifying means first transistor (46) causes the third transistor (98) to turn OFF via the emitter voltage of the fifth transistor (130), thereby reducing the base current to the associated differential amplifying means first transistor (46), and further insuring turn-OFF of that transistor, and further so that upon initial turn-ON of the differential amplifying means second transistor (47), the voltage at the corresponding collector resistor-collector junction causes the emitter of the sixth transistor (132) to have a voltage lower than the emitter voltage of the fifth transistor (130), thus turning ON the corresponding fourth transistor (99) whose collector current then causes the associated differential amplifying means second transistor (47) to turn-ON more fully until a fully ON state of the differential amplifying means second transistor (47) is achieved, and wherein the turn OFF of the differential amplifying means second transistor (47) causes the fourth transistor (99) to turn OFF via the emitter voltage of the sixth transistor (132), thereby reducing the base current to the associated differential amplifying means second transistor (47) and further insuring turn-OFF of that transistor.

5. An improved line receiver as defined in claim 4, wherein the sinking current mirrors comprise emitter-coupled transistors, each having a base, an emitter and a collector, and wherein the sourcing current mirrors comprise emitter-coupled transistors, each having a base, an emitter, and a collector, such that for any increase in current flow by a sinking current mirror a concomitant decrease in current flow is applied by the sourcing current mirror.

6. An improved line receiver as defined in claim 5, wherein the means for differentially amplifying the differential voltage between the differential input means comprises first and second emitter-coupled transistors, each having a base, an emitter and a collector, said second transistors having their respective bases connected to one of the current summing nodes.

7. An improved line receiver as defined in claim 6, further wherein the means for differentially amplifying the differential voltage between the input terminals comprises emitter follower transistors (130 and 132), each having a base, an emitter and a collector, the base of each emitter follower transistor respectively connected to the collector of one of the first and second emitter-coupled transistors (46 or 47), and further comprising current sources connected to the emitters of these emitter follower transistors so as to provide a means for pulling down the voltage of the emitter follower transistors emitters, whereby the emitters of these emitter follower transistors can drive emitter coupled logic type circuitry.

8. An improved line receiver as defined in claim 6, further wherein the means for differentially amplifying the differential voltage between the input terminals comprises emitter follower transistors (130 and 132), each having a base, an emitter and a collector, the base of each emitter follower transistor respectively connected to the collector of one of the first and second emitter-coupled transistors (46 or 47), and further comprising a current mirror (124) with a collector output, the current mirror connected to the emitters of these emitter follower transistors, and further comprising an amplifier output module connected to the collector output of the current mirror (124) so as to current amplify the differential voltage of the first and second emitter-coupled transistors (46 and 47) so as to generate voltage levels compatible to transistor-transistor logic (TTL), integrated injection logic ($I^2L$) and integrated Schottky logic (ISL).

9. An improved line receiver as defined in claim 3, further wherein the means for differentially amplifying the differential voltage between the input terminals comprises emitter follower transistors (130 and 132), each comprising a base, an emitter and a collector, the base of each emitter follower transistor respectively connected to the collector of one of the first and second emitter-coupled transistors (46 or 47), and further comprising current sources connected to the emitters of these emitter follower transistors so as to provide a means for pulling down the emitter voltage of the emitter follower transistors, whereby the emitters of these emitter follower transistors can drive emitter coupled logic (ECL) type circuitry.

10. An improved line receiver as defined in claim 9, further wherein the means for differentially amplifying the differential voltage between the input terminals comprises emitter follower transistors (130 and 132), each comprising a base, an emitter and a collector, the base of each emitter follower transistor respectively connected to the collector of one of the first and second emitter-coupled transistors (46 or 47), and further comprising a current mirror (124) with a collector output, the current mirror connected to the emitters of these emitter follower transistors, and further comprising an amplifier output module connected to the collector output of the current mirror (124) so as to current amplify the differential voltage of the first and second emitter-coupled transistors (46 and 47) so as to generate voltage levels compatible to transistor-transistor logic (TTL), integrated injection logic ($I^2L$) and integrated Schottky logic (ISL).

* * * * *

UNITED STATES PATENT AND TRADEMARK OFFICE
CERTIFICATE OF CORRECTION

PATENT NO. : 4,742,309

DATED : May 3, 1988

INVENTOR(S) : John W. Chu

It is certified that error appears in the above-identified patent and that said Letters Patent are hereby corrected as shown below:

Column 16, line 17 - change "ncde" to --mode--

Signed and Sealed this

Sixth Day of September, 1988

Attest:

DONALD J. QUIGG

*Attesting Officer*    *Commissioner of Patents and Trademarks*